United States Patent [19]

Nishizawa et al.

[11] Patent Number: 4,935,798
[45] Date of Patent: Jun. 19, 1990

[54] STATIC INDUCTION TYPE THYRISTOR

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 47,292

[22] Filed: May 8, 1987

Related U.S. Application Data

[60] Division of Ser. No. 848,343, Apr. 4, 1986, Pat. No. 4,772,926, which is a continuation of Ser. No. 647,871, Sep. 6, 1984, abandoned, which is a continuation of Ser. No. 441,213, Nov. 12, 1982, abandoned, which is a continuation of Ser. No. 115,250, Jan. 21, 1980, abandoned.

[30] Foreign Application Priority Data

Jan. 26, 1979 [JP] Japan .................................. 54-8366

[51] Int. Cl.⁵ .............................................. H01C 29/74
[52] U.S. Cl. ......................................... 357/38; 357/22; 357/86
[58] Field of Search ..................... 357/22, 22 D, 22 E, 357/38, 38 T, 86

[56] References Cited

U.S. PATENT DOCUMENTS 4,223,328  9/1980  Terasawa et al. ..................... 357/38
4,514,747  4/1985  Miyata et al. .......................... 357/86

FOREIGN PATENT DOCUMENTS 54-22179   2/1979  Japan .................................. 357/38 T
54-106176  8/1979  Japan .................................. 357/38 T Primary Examiner—Joseph E. Clawson, Jr.
Attorney, Agent, or Firm—Cushman, Darby & Cushman

[57] ABSTRACT

In a static induction type thyristor comprising a low impurity concentration channel region having opposed first and second major surfaces, a first main electrode region having one conductivity type and a second main electrode region having another conductivity type opposite to the one conductivity type and provided on the first and second major surfaces, respectively, and a gate region provided in the vicinity of the first main electrode region, there intervenes, between the channel region and the second main electrode region, a thin layer region having the same conductivity type as that of first main electrode region. The provision of this thin layer reegion contributes to allowing a markedly low impurity concentration as well as a decreased thickness of the channel region for a given maximum forward blocking voltage, making it feasible to obtain a high maximum forward blocking voltage and a high switching speed.

18 Claims, 15 Drawing Sheets

STATIC INDUCTION TYPE THYRISTOR

BACKGROUND OF THE INVENTION

This is a division of application Ser. No. 848,343, now U.S. Pat. No. 4,772,926 filed Apr. 4, 1986 which is a continuation of Ser. No. 647,871 filed Sept. 6, 1984 (abandoned) which was a continuation of Ser. No. 441,213 filed Nov. 12, 1982 (abandoned) which was a continuation of Ser. No. 115,250 filed Jan. 21, 1980 (abandoned).

(a) Field of the Invention:

The present invention concerns static induction thyristor having a high blocking voltage, a low forward voltage drop, and a high switching speed.

(b) Description of the prior art:

Conventional thyristors, basically, are formed by a four-layer structure of pnpn. In such conventional thyristors it is difficult to carry out switching-off action using only a control or gate voltage. Further, even when cut-off is effected, cut-off is effected by this gate voltage, its speed is very low. In contrast thereto, static induction thyristor (hereinafter to be called SI-thyristor) which is basically constructed by a gated diode structure, i.e. anode region, cathode region and gate means integrated in either of the anode or cathode region. The SI-thyrister has the features that turn off has the features that cutting-off, after region operation by the gate voltage is early, and that its cutting-off time is quick. However, the blocking voltage of the conventional SI thyristor is mainly determined by the thickness of a high-resistivity active region which, in turn, forms a limiting factor for the forward voltage drop. Therefore, simultaneous attainment of a high blocking voltage and a low forward voltage drop is difficult.

SUMMARY OF THE INVENTION

It is the object of the present invention to provide a static induction thyristor which eliminates the foregoing drawbacks of the conventional thyristors, and which has a small voltage drop, a high maximum forward blocking voltage, and a high switching speed.

BRIEF DESCRIPTION OF THE DRAWINGS

FIGS. 2A through 2E are diagrammatic illustrations of examples of sectional structures of the static induction thyristor according to the present invention, in which:

FIG. 2A is a diagrammatic sectional view taken along the line A—A' in FIG. 2B.

FIG. 2B is a diagrammatic plan view.

FIG. 2C to FIG. 2E are diagrammatic illustrations of potential distributions between the gate region and the anode region.

DETAILED DESCRIPTION OF THE PREFERRED EMBODIMENTS

Figure 1A:
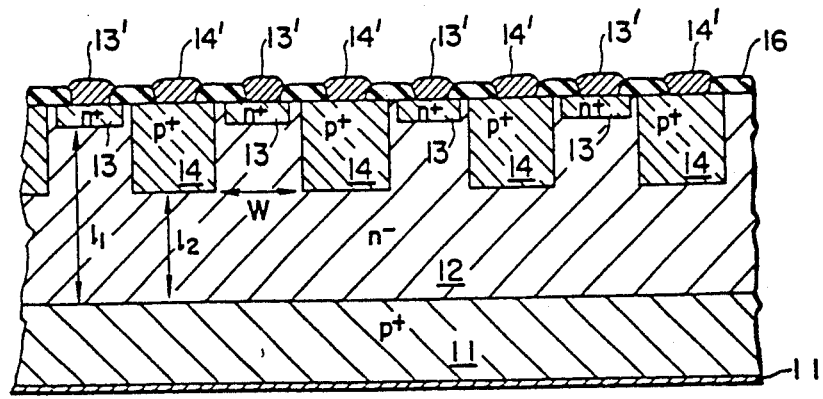
FIG. 1A is a diagrammatic illustration of an example of sectional structure of a conventional static induction thyristor.

A typical structural example and the operating principles of the conventional SI-thyristor are illustrated in FIGS. 1A to 1G. In FIG. 1A, there is shown a sectional view of a typical example of the surface gate structure of an SI-thyristor.

The conventional SI thyristor will be described first and analized to help the understanding of the present invention.

Figure 1B:
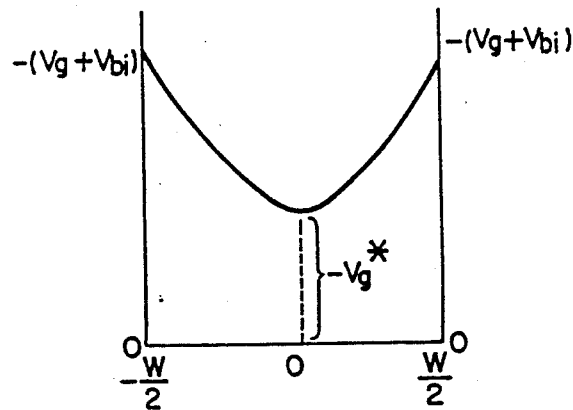
FIG. 1B is a diagrammatic illustration of a potential distribution between the gate regions of same.
Figure 1C:
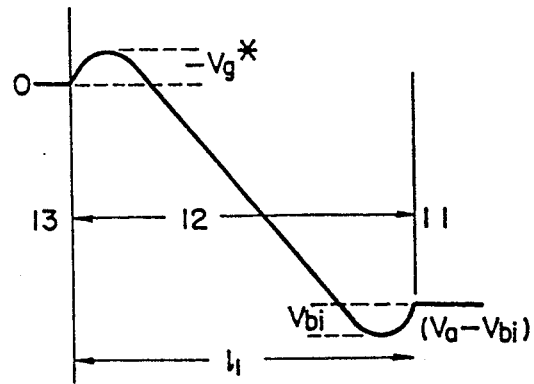
FIGS. 1C and 1D are diagrammatic illustrations of potential distributions between the cathode region and the anode region of same.
Figure 1D:
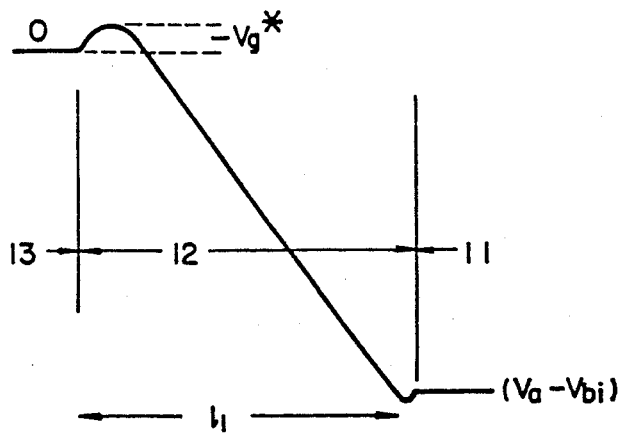
Figure 1E:
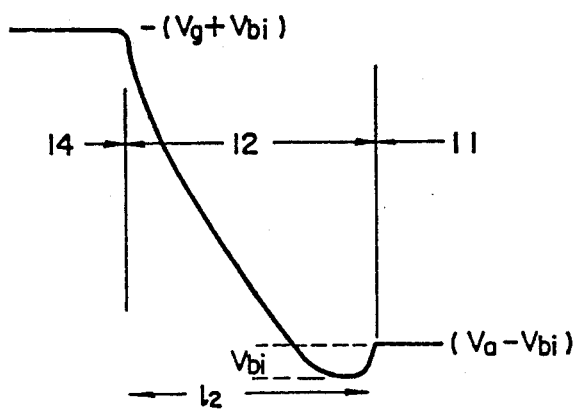
FIGS. 1E to 1G are diagrammatic illustrations of potential distributions between the gate region and the anode region of same.
Figure 1F:
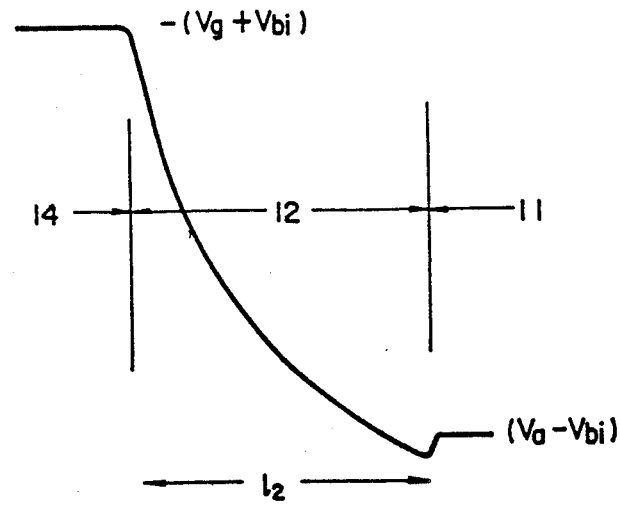
Figure 1G:
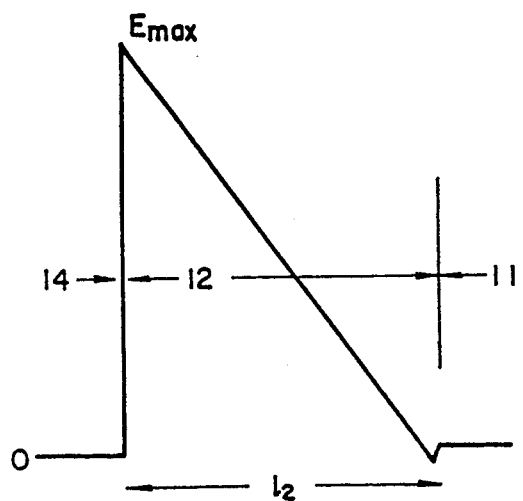

In FIG. 1A, p+ regions 11 and 14 represent anode region and a gate region, respectively. An n+ type region 13 represents a cathode region. Although shown in a cross-sectional view in FIG. 1A, regions 14 and 11 are layers of p+ semiconductor material. An n− region 12 represents a region for constructing a channel. Numerals 11', 13' and 14' represent an anode electrode, a cathode electrode, and a gate electrode, which may be made of a layer of Al, Mo, W, Au or other metals, or a low resistivity polysilicon, or their composite structure. Numeral 16 represents an insulating layer made of $SiO_2$, $Si_3N_4$, $Al_2O_3$, AlN or like substances, or their mixture, or their composite insulating layer. A a cut-off state in which there is no flow of current can be provided even under the application of a positive voltage to the anode region, as will be explained hereinafter by referring to the potential distributions shown in FIG. 1B through 1F. FIG. 1B shows a potential distribution in a section of a channel region 12 between gate regions 14 at the cut-off time. FIGS. 1C and 1D show potential distributions between a cathode region 13 and An anode region 11 at the cut-off time. FIGS. 1E and 1F show potential distributions between the gate region 14 and the anode region 11 at the cut-off time. FIG. 1G shows a field distribution between the gate region 14 and the anode region 11.

FIG. 1B shows the potential distribution in the transverse direction of the channel region in the state wherein a predetermined reverse bias ($V_g=0$ included) is applied to the gate region. Those potential distributions shown in FIGS. 1B to 1F and mentioned subsequently are illustrated and described for electrons. It should be understood that electrons can reach, with greater ease, those sites having a lower potential. Accordingly, the reverse is the case for holes having an opposite or positive electric charge, and these holes will reach a place having a higher potential for electrons with greater ease. Through-out FIGS. 1B to 1F, the null or reference potential refers to the potential of the cathode region. In FIG. 1B, $V_{bi}$ represents the built-in or diffusion potential between the gate region 14 and the channel region 12. If potential $V_g^*$ at the central portion of the channel region is sufficiently greater than the thermal energy kT (k represents Boltzmann constant, and T represents absolute temperature) which the electrons possess, there will hardly be any injection of electrons from the cathode region over this barrier toward the anode region. FIGS. 1C and 1D show potential distributions from the cathode region to the anode region along the central portion of the channel region. The anode voltage $V_a$ in FIG. 1D is noted to be higher than that shown in FIG. 1C. Symbol $V_{bi}$ shown on the anode side represents a built-in or diffusion potential between the anode region 11 and the channel region 12. Injection of electrons from the cathode region 13 is suppressed by the maximum of potential which is produced in the foreground of the cathode region, i.e. by the potential barrier $-V_g^*$ of the intrinsic gate. At the anode side, on the other hand, the potential of that portion of the $n^-$ type region 12 located in the vicinity of the anode region 11 remains lower than that of the anode region 11 to retain the state of not having perfectly been punched through. Accordingly, the injection of holes from the anode region 11 into the channel region 12 is suppressed by the built-in potential at the $p^+n^-$ junction. In other words, the potential barrier due to the $p^+n^-$ junction remains there because said portion is not in the punched through state. Thus, the path leading from the cathode region 13 up to the anode region 11 which forms an $n^+n^-P^+$ diode structure is prevented from being turned on, and no current is allowed to flow even when a forward voltage is applied to such structure. More particularly, the current path from the cathode region to the anode region is of a diode structure of $n^+n^-p^+$. Yet, even when a forward voltage is applied to the structure, gate means, formed in the $n^-$ type region, prevents injection of carriers, and no current is allowed to flow. More specifically, a potential barrier for electrons is produced on the cathode side, and another one for holes on the anode side. The potential barriers serve to suppress the injection of respective carriers, and, thus, the flow of a current. Furthermore, the potential distribution when the anode voltage $V_a$ is increased is shown in FIG. 1D. By increasing the reverse gate voltage $V_g$ in accordance with an increase in the anode voltage $V_a$ within the range of the breakdown voltage between cathode region and the gate region, it is always possible to produce, on the cathode region side, potential barrier having a sufficiently great height. Let us now assume that the region between the gate region and the cathode region has a breakdown voltage which is sufficiently great to realize a maximum forward blocking voltage. However, if the anode voltage $V_a$ increases further, and if, accordingly, the $n^-$ type region 12 becomes almost completely depleted up to the anode region, the potential barrier on the anode region side which serves to suppress the injection of holes will become low as illustrated. At such state, the injection of electrons from the cathode region side is suppressed, but holes will be injected from the anode region side. These holes will flow toward the portion having a higher potential. Under such circumstance, holes will flow also into the vicinity of the intrinsic gate. Therefore, the potential barrier at the intrinsic gate will be substantially lowered, causing injection of electrons from the cathode region, so that current will begin to flow. This state defines the maximum forward blocking voltage. If, however, the gate-cathode breakdown voltage is not sufficient, a sufficiently high potential barrier on the cathode side is not produced, and even when the injection of holes is sufficiently suppressed on the anode side, injection of electrons from the cathode side will take place, and thus a flow of current can begin.

FIGS. 1E and 1F show gate-anode potential distributions under two different anode voltages $V_a$, as shown in FIGS. 1C and 1D. The gate region, the channel region and the anode region form a $p^+n^-p^+$ structure. In the state that a positive voltage $V_a$ is applied to the anode region, and that a reverse bias (negative voltage, and including $V_g=0$) is applied to gate region 14, the gate side $p^+n^-$ junction will be reverse biased, and the anode side $n^-p^+$ junction will be forward biased. Accordingly, a depletion layer will spread from the gate side toward the anode region. FIG. 1F shows the state wherein the depletion layer has reached the anode side $n^-p^+$ junction. The intensity of electric field will be the greatest in that portion of the $n^-$ region located in the vicinity of the gate region. The gate-anode electric field distribution is shown in FIG. 1G for the state corresponding to the potential distribution shown in FIG. 1F. As a matter of course, the maximum electric field intensity $E_{max}$ has to be made smaller, in value, than the breakdown electric field $E_B$ at which avalanche beings to take place. If the maximum field $E_{max}$ exceeds $E_B$, even where a voltage is applied that will not cause disappearance of the potential barrier on either the cathode side or on the anode side, the maximum forward blocking voltage will become determined by this voltage.

Characteristics which are required of a thyristor which is a switching device of large electric power are enumerated, for example, as follows: (1) a large maximum forward blocking voltage $V_{Bamax}$; (2) a large voltage amplification factor $\mu$ (a large blocking voltage is materialized by as low a gate voltage as possible); (3) a large current I in the conducting state; (4) a small voltage drop $V_{fd}$ in the conducting state; (note: Items (3) and (4) mean a small resistance during conduction; (5) a high switching speed; (6) a large current gain G at cutting-off time.

In order to increase the blocking voltage, it is necessary to increase the distance $l_2$ between the gate region and the anode region, in FIG. 1A. In the structure illustrated, however, it should be understood that, if this distance $l_2$ is made greater than a certain extent, the electric field intensity $E_{max}$ in the vicinity of the gate region becomes great enough to surpass the breakdown electric field $E_B$ at which avalanche start. Thus, the maximum blocking voltage will be decided by the avalanche. Though depending also on the thickness of the concerned region, the threshold value of electric field for starting avalanche, in silicon semiconductor, is about 200 KV/cm, and in case of GaAs it is a little higher than that. It should also be noted also that an excessively lengthy distance $l_2$ will prolong the transit time of carriers which, in turn, will contribute to delaying the switching speed of the device, and will increase the voltage drop $V_{fd}$ in conducting state.

It is desirable, so far as the maximum blocking voltage permits, that the $n^-$ type region 12 have as small a thickness as possible in order to obtain a higher switching speed, a large current flow and a smaller voltage drop. In order to realize them, the internal electric field intensity is required to be as uniform as possible, and maintained at a value smaller than the avalanche breakdown electric field $E_B$. In order to uniformalize this electric field intensity, it is desirable that the impurity concentration $N_D$ of the $n^-$ type region 12 is as low as possible. If, however, the impurity concentration of this $n^-$ type region 12 is excessively low, this region will become completely depleted by a low anode voltage up to the vicinity of the anode region. Thus, the hole-injection suppressing mechanism on the anode side will become weak, so that the maximum blocking voltage $V_{Bamax}$ will drop.

Figure 2A:
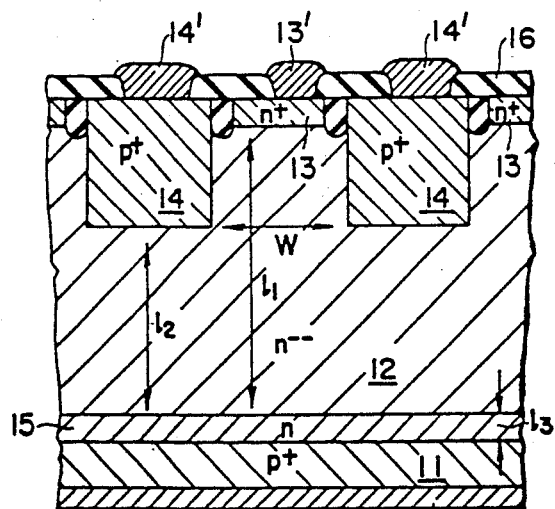
Figure 2B:
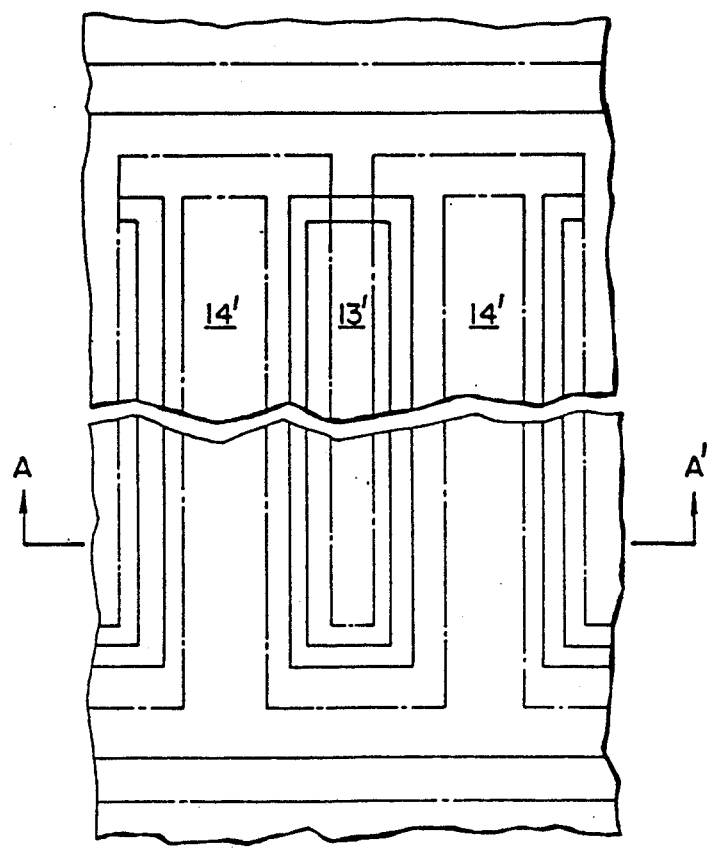
Figure 2C:
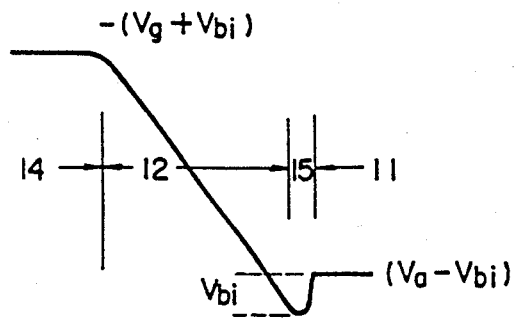
Figure 2D:
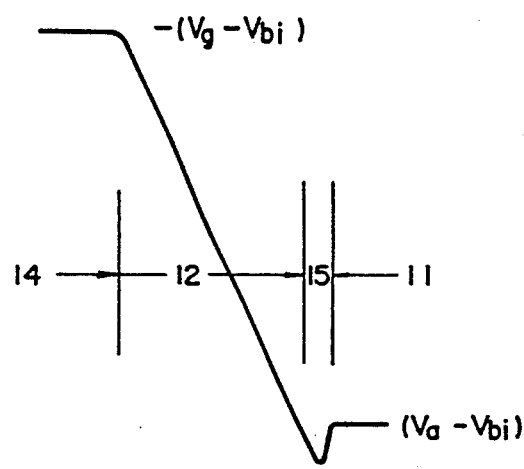

FIG. 2A schematically shows an embodiment of the static induction thyristor in accordance with the present invention. In order to arrange so that the intensity of the internal electric field is made as uniform as possible, and that no current will begin to flow until a predetermined level of anode voltage is applied, the formation of a region of relatively high impurity concentration adjacent to the anode region as shown in FIG. 2A is found to be effective. More specifically, most of the region located between the gate region and the anode region is constructed with an n⁻ type region 12 having a very low impurity concentration, and an n type region 15 having a relatively high impurity concentration is provided only in the vicinity of the anode region. Other regions may be exactly the same as those shown in FIG. 1A. FIG. 2B is a diagrammatic plan view of an example of the static induction thyristor. FIG. 2A illustrates a unit including a single channel taken along the sectional line A—A' in FIG. 2B. FIG. 2C and FIG. 2D illustrate gate-anode potential distributions. The anode voltage $V_a$ shown in FIG. 2D is noted to be greater as compared with that shown in FIG. 2C. Similar reference numerals to those of FIG. 1A denote similar parts. As noted, an n type region 15 is newly provided between the channel region 12 and the anode region 11. In this embodiment, the maximum blocking voltage $V_{Bamax}$ is determined mainly by the thickness of the n⁻ type region 12, and the suppression of injection of holes on the anode side is carried out by the n type region 15.

Figure 2E:
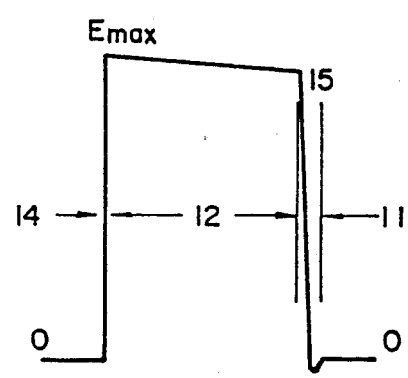

The potential distribution shown in FIG. 2D substantially corresponds to the state in which a maximum blocking voltage is applied. As noted, the state is such that a depletion layer extending from the gate region has entered into the n type region 15 and almost arrives at the anode region 11. The maximum electric field $E_{max}$, at such time as stated above, at the interface between the n⁻ type region 12 and the gate region 14 is set to be slightly smaller than $E_B$ (see FIG. 2E), and avalanche has not started yet. It is desirable to design so that when the maximum blocking voltage is applied, the reverse bias applied between the cathode and the gate region is close to the gate-cathode breakdown voltage. It should be understood that, the closer the position of the gate region to the cathode region is, the shorter the length of the gate region itself, extending toward the anode region (in the direction of the main current) can be made, so that a high voltage can be blocked, and the forward voltage drop $V_{fd}$ can be made small. If the thickness of the n type region 15 is excessively great, region 15 will not become depleted even in response to application of a maximum blocking voltage, and accordingly a region of flat potential distribution will remain present for an extended period of time. That is, even when the gate is opened to cause electrons to, flow into the n type region 15 and, accordingly, the electrons are stored therein to reduce the potential barrier on the anode side, the efficiency of injection of holes from the anode region into the channel region will drop, and at the same time the speed the holes being injected will become retarded, causing a degradation of the switching speed and an increase in $V_{fd}$. Thus, the smaller the thickness of the n type region 15 is, the more desirable. As a rough measure, the thickness of the n type region is preferably smaller than the diffusion length of the minority carrier, at the highest. In order to arrange, for the n type region 15 to have thickness and also for the depletion layer to almost arrive at the anode region in response to a predetermined maximum blocking voltage, it will be understood from the foregoing description that the higher the impurity concentration of the n type region 15 is, the more desirable. However, the higher the impurity concentration of the n type region 15 is, the more the height of the potential barrier for holes is pulled up (the illustrated potential for electrons is pulled down), so that the amount of those electrons which will have to flow into said region will become great, and thus there will arise the inconvenience that the switching time is slightly delayed.

Here, let us assume that the impurity concentration on the n⁻ type region 12 is designated as $N_{D1}$. The difference in the intensities of electric fields at the end of the gate region 14 and at the site of the n⁻ type region 12 located adjacent to the n type region 15 when said n⁻ type region 12 is entirely depleted is given substantially by: $N_{D1}ql_2/\epsilon$. Here q represents the magnitude of the electronic charge, and $\epsilon$ represents the dielectric constant. Suppose that $l_2 = 500\mu m$, the value of $N_{D1}ql_2/\epsilon$ when $N_{D1}=1 \times 10^{13} cm^{-3}$ will become approximately 80 KV/cm. When the intensity of electric field $E_{max}$ at the end surface of the gate region is selected at 150 KV/cm, neglecting the thickness of the n type region 15, a blocking voltage of about 5500V can be realized. If $E_{max}$ is allowed up to 180 KV/cm, there can be realized a blocking voltage of about 7000V. If $N_{D1}=1\times10^{12}$ cm⁻³, $N_{D1}ql_2/\epsilon$ will become about 8 KV/cm. In such instance, if the intensity of electric field at the end surface of the gate region, $E_{max}$, is selected at 150 KV/cm, a blocking voltage of about 7200V can be realized. Now, let us suppose that $l_2$ is, for example, 50µm. The value of $N_{D1}ql_2/\epsilon$ when $N_{D1}=10^{13}$ cm⁻³ will become about 8 KV/cm. When $N_{D1}=1\times10^{12}$ cm⁻³, $N_{D1}ql_2/\epsilon$ will become about 0.8KV/cm. In such cases if $E_{max}$ is selected at 150 KV/cm, maximum forward blocking voltages of about 730V and 750V for the cases, of $N_{D1}=10^{13}$ and $^{12}$cm⁻³, respectively, can be realized. By setting $N_{D1}$ at a value of about $1 \times 10^{13}$ cm⁻³, a blocking voltage of, for example, 400V can be realized by selecting $l_2$ of 27µm or even smaller. The intensity of the electric field at the boundary the n⁻ type region 12 and the n type region 15 can be given by: $E_{max} - N_{D1}ql_2/\epsilon$. Accordingly, the impurity concentration $N_{D2}$ of the n type region 15 and its thickness $l_3$ may be determined so as to approximately satisfy the following relationship:

$$E_{max} - \frac{N_{D1}ql_2}{\epsilon} \lesssim \frac{N_{D2}ql_3}{\epsilon}. \qquad (1)$$

IF $N_{D2}=1\times10^{16}$ cm⁻³, a value of about 1µm for $l_3$ will be sufficient for all the cases. In case $N_{D2}$ $1\times10^{17}$ cm⁻³, a value of 0.1~0.2 µm for $l_3$ will be sufficient for all the cases. If $N_{D2}=1 \times 10^{15}$ cm⁻³, the value for $l_3$ would be about 10µm or smaller. When the impurity concentration $N_{D1}$ and $N_{D2}$ differ much, the maximum blocking voltage $V_{Bamax}$ can be given approximately by the following formula:

$$V_{Bamax} \approx \left(E_{max} - \frac{N_{D1}ql_2}{2\epsilon}\right)l_2 + \frac{N_{D2}ql_3^2}{2\epsilon}. \qquad (2)$$

In order to realize this maximum blocking voltage, the cathode-gate breakdown voltage should be sufficiently high to enable the application of a sufficiently high reverse gate bias to establish a potential barrier in the channel region sufficient to prevent injection of electrons from the cathode side. The maximum field $E_{max}$ can be determine in relation with the avalanche breakdown field $E_B$. According to Equation (2), it will be understood that, in order to materialize a large blocking voltage by as small a thickness $l_2$ as possible, the smaller the value of $N_{D1}$ is the more desirable. More specifically, the region 12 desirably is either an intrinsic semiconductor, or a nearly intrinsic semiconductor. In other words, it is desirable to select $N_{D1}$ so that $N_{D1}ql_2/2\epsilon$ is sufficiently small as compared with $E_B$.

As stated above, in the static induction thyristor, the height of the potential barrier at the intrinsic gate on the cathode side and the height of the potential barrier on the anode side should be high enough to prevent the injection of carriers, and the intensity of electric field at the interface of the gate region with the anode side channel region should not surpass the avalanche breakdown field $E_B$. Considerations have been given to the realization of a maximum forward blocking voltage $V_{Bamax}$ in a device having as small a thickness as possible. Since the intensity of the internal electric field is substantially uniform throughout the concerned main portion, the current density in the conducting state is large, and along therewith the forward voltage drop is small. Also, even when the device is cut off by applying a reverse bias voltage to the gate region, most of the carriers are running in drift field, so that the switching time is short.

Description will hereunder be made of further embodiments of the present invention. It should be understood that, in those structures which are to be shown hereinafter, only one channel unit will be shown for the simplicity of explanation. In order to design a structure for large current, it is only necessary to form a multichannel structure including a multiplicity of such units arranged in parallel.

Figure 3:
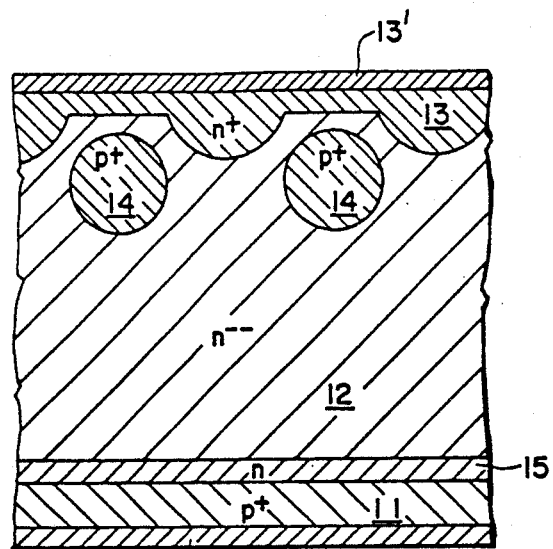
FIG. 3 to FIG. 12 are diagrammatic illustrations of examples of sectional structures of the static induction thyristor according to the present invention.

FIG. 3 shows a sectional structure of another embodiment of the static induction thyristor having an embedded gate structure. A p+ type region 14 serving as the gate region is embedded either in mesh shape or stripe shape in an n− type region 12. An n+cathode region 13 protrudes toward the central portion of each channel region. The portion located between the gate region and the cathode region is a common region with said n− type region 12. Depending on the manner of manufacture, however, such portion can be replaced with a different region than the n− type region 12. Because of the fact that a high resistivity region is present between the gate region and the cathode region, the gate-cathode breakdown voltage is high, and the gate-cathode static capacitance is small. FIG. 3 shows an instance wherein the cathode n+ type region 13 extends throughout the entire main surface of the semiconductor. It should be understood, however, that there can be employed a structure in which the n+ type cathode region 13 is provided only in the vicinity of the central portion of the channel and protrudes toward the central portion of the channel region. It should be understood also that this n+ type region 13 may be flat without having such protruding portion. In this embedded gate structure, the inconveniences that the gate resistance tends to become high, and that the switching speed is retarded tend to exist. To overcome such inconveniences, the length of the stripe-shaped gate region may be made small, and this stripe-shaped gate region is drawn into the surface of the semiconductor body and a metal electrode is provided thereon.

Figure 4:
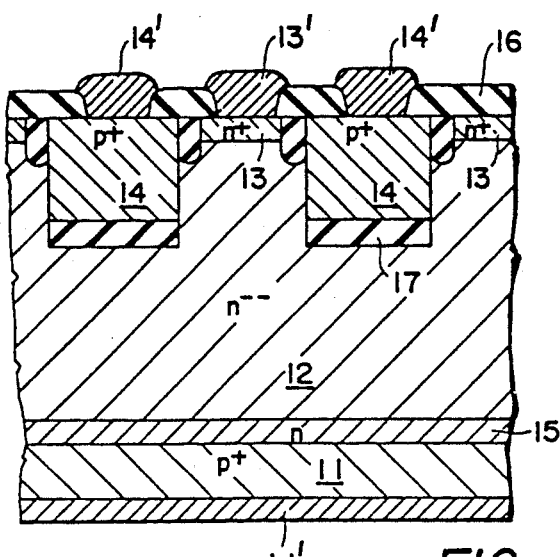

FIG. 4 shows a structure wherein an insulating layer 17 is provided on that surface of the gate region which faces the anode region. On the insulating layer 17 is provided a p+ type gate region 14. In this structure, the main portion of the gate region 14 need not be a single crystal, but it may be poly-crystalline, or it may be porous crystal. Because of the fact that an insulating layer 17 is provided on the bottom surface of the gate region 14, the amount of those holes, among the holes which are allowed to flow from the anode region, which flow into the gate region is made small, and a static induction thyristor having a large current gain (turn-off gain) is obtained.

FIGS. 5A to 5C and 6 show embodiments of insulated-gate type static induction thyristors. Since a static induction thyristor performs on-off control by controlling the channel potential by the gate region, the gate structure is not limited to junction type, but, basically speaking, any structure may be employed.

Figure 5A:
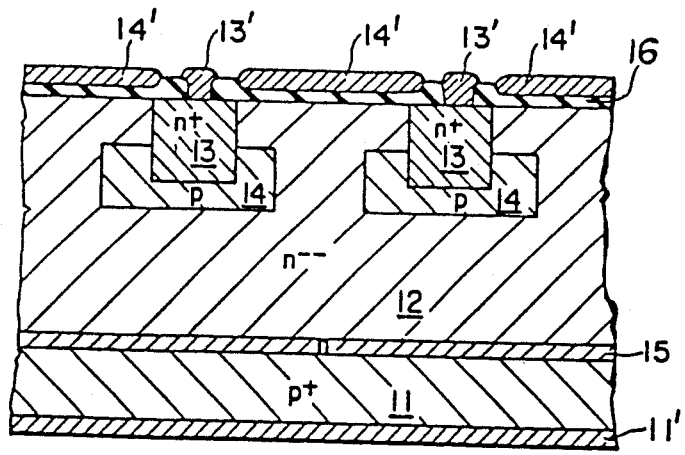

FIG. 5A shows a structure wherein an insulated gate region is provided on the main surface of the semiconductor body. In this example, a p type region 14 is not intended to play the role of a main or driving gate. Electrons located in the cathode region are first controlled by an insulated gate 14' and are allowed to flow horizontally through that portion of the channel region which is surrounded by said insulated gate (hereinafter to be called MOS-gate) and by a p type region 14, substantially along the main surface of the semiconductor body. Thereafter, the electrons will flow vertically therefrom toward the anode region 11.

Figure 5B:
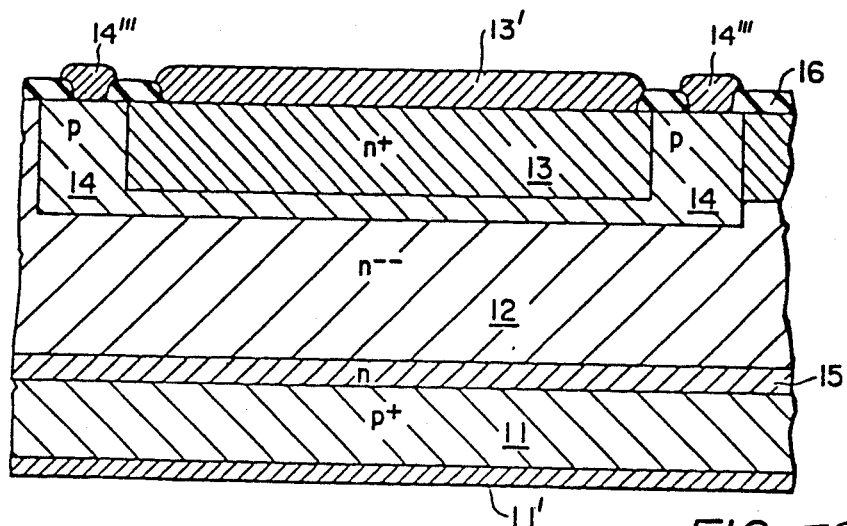

FIG. 5B shows another sectional structure which is perpendicular to the surface of the sheet of drawing and cutting through a cathode region 13 of FIG. 5A. In this FIGURE, an independent electrode 14''' is shown to be provided on the p type region 14. This electrode 14''' may be given an independent potential, or it may be electrically floated. This electrode 14''' may also be directly coupled to a cathode electrode 13'. In such an instance, those holes injected from the anode region mostly will flow into the p type region 14, and therefrom they will flow to the cathode electrode 13' via the electrode 14'''. Accordingly, the removal of those holes from the channel region 12 is good, and the operating speed is high. Because the structure is of the MOS-gate type, the current gain is very large as a matter of course. Where a p type region 14 is in the floating state, the illustrated structure will exhibit an operation similar to that of a conventional thyristor due to those holes which have travelled into the p type region 14. This which will provide a negative resistance characteristic but may make cutting-off by the MOS-gate impossible. For this reason, it is desirable, usually, to couple this electrode 14''' directly to the cathode electrode 13', or to give an independent bias potential thereto.

Figure 5C:
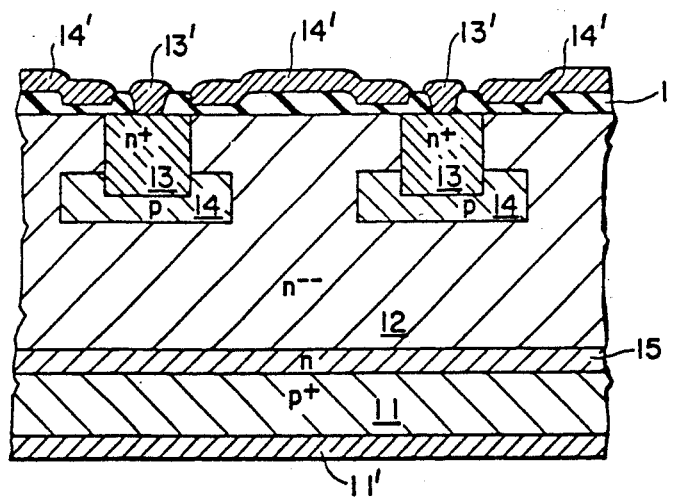

FIG. 5C shows an improvement of the structure shown in FIG. 5A. In FIG. 5A, a MOS-gate structure is provided uniformly between adjacent cathode regions 13. For quickly turning on the thyristor, there preferably exists a drift field from the cathode region 13 to the anode region. Elongated gate electrode 14' may work contrary to this purpose. Further, when an electron current flows, there is an IR voltage drop also in the horizontal portion of the current channel subjected to the control of the gate electrode 14'. This IR voltage drop will make the effective gate bias deep and provide a negative feedback action for the flow of electrons. To overcome this inconvenience, such a MIS gate structure as shown in FIG. 5C can be adopted, in which the thickness of the insulating layer is increased in the vicinity of the central portion between the adjacent cathode regions. The thickness and the impurity concentration of the p type region in the structures shown in FIGS. 5A and 5C are selected to prevent the occurrence of a the punching-through state between the anode region and the cathode region; i.e. to prevent of a hole current from flowing directly therethrough at the time of application of the maximum blocking voltage. Along therewith, in view of the fact that a current will flow through the p type region 14, the dimensions and the impurity concentration of this region need to be selected to make the voltage drop due to the current flow sufficiently small so as to be substantially ignored. This means that its impurity concentration desirably is relatively high.

Figure 6:
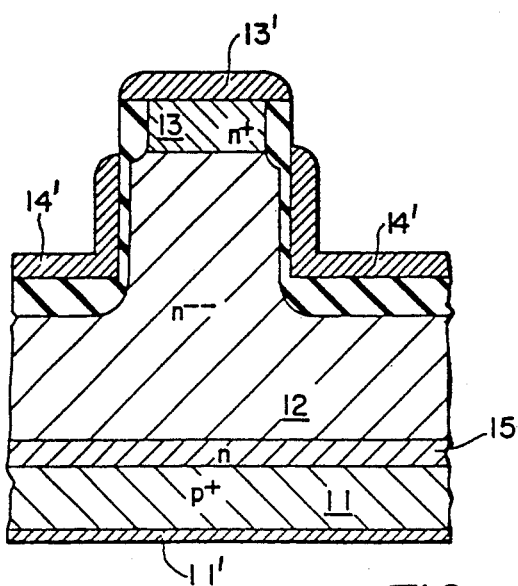

FIG. 6 similarly shows a schematic sectional view of an embodiment of a static induction thyristor having a MIS-gate structure. As is shown in the FIGURE, a MIS-gate structure is provided along a side surface of a recessed portion.

This MIS type static induction thyristor employs a $p^+nn^-n^+$ configuration. Accordingly, all of the holes which have flown from the anode region will enter into the cathode region. Thus, this structure has the inconvenience that the speed of cut-off time is slightly delayed. However, the turn-off gain of this structure is very great. It should be understood that the insulated gate electrodes shown in FIGS. 5 and 6 may be comprised of Schottky electrodes to form Schottky gate thyristors.

Figure 7A:
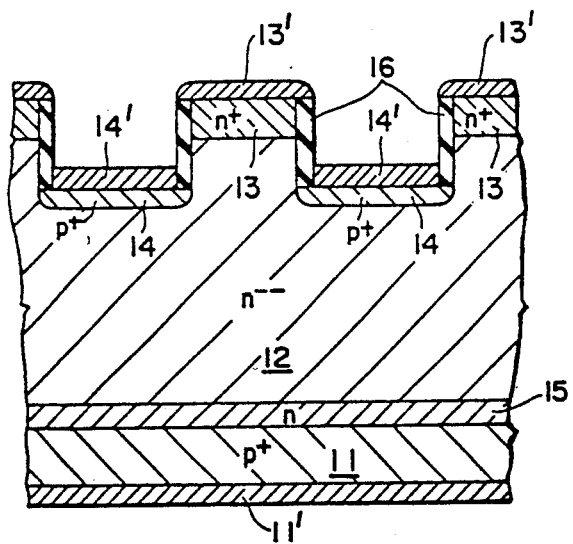
Figure 7B:
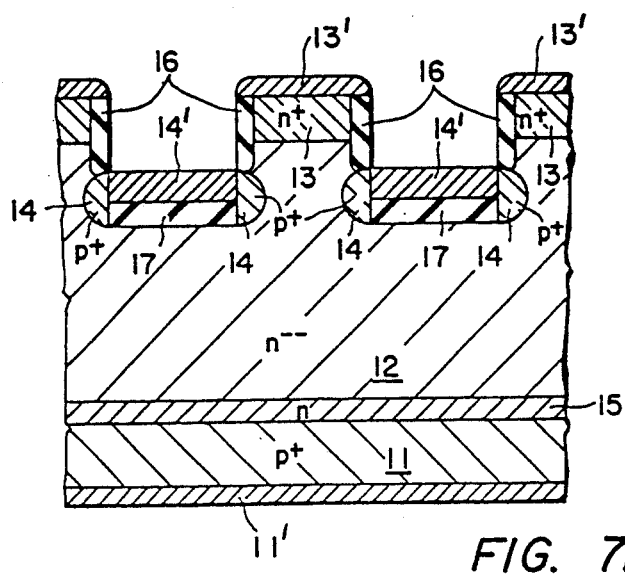

FIGS. 7A and 7B show further embodiments of the static induction thyristor. FIG. 7A shows an embodiment wherein a $p^+$ type region is provided on the bottom surface of a recessed portion, to serve as a gate region. FIG. 7B shows an instance wherein $p^+$ type regions are provided on the side surfaces located in the vicinity of the bottom surface of a recessed portion, to serve as gate regions. These embodiments have such features that the gate-cathode capacitance is reduced and that the gate-cathode breakdown voltage is improved. In FIG. 7A, a $p^+$ type region 14 is provided on the entire bottom surface of a recessed portion and faces the anode region 11 in a relatively wide area. A large number of holes may flow from the anode region into the gate region 14, and thereby the current gain may tend to become small. In contrast thereto, in the structure shown in FIG. 7B, the gate regions are small in size and located almost at the foreground of the cathode region, so that the amount of hole current which flows into the gate regions is small, thereby providing a large current gain.

FIGS. 8 through 11 show static induction thyristors having split-gate structures. Namely, the gate region is split into two or more regions. In the Figures, one of the $p^+$ type gate regions is given a fixed potential including zero to establish a subsidiary potential distribution in the channel region, and concurrently therewith, this $p^+$ type gate region serves as an electrode for absorbing holes out. In the embodiments shown in FIGS. 8 through 11, the fixed potential gate region is directly coupled to the cathode region.

Figure 8:
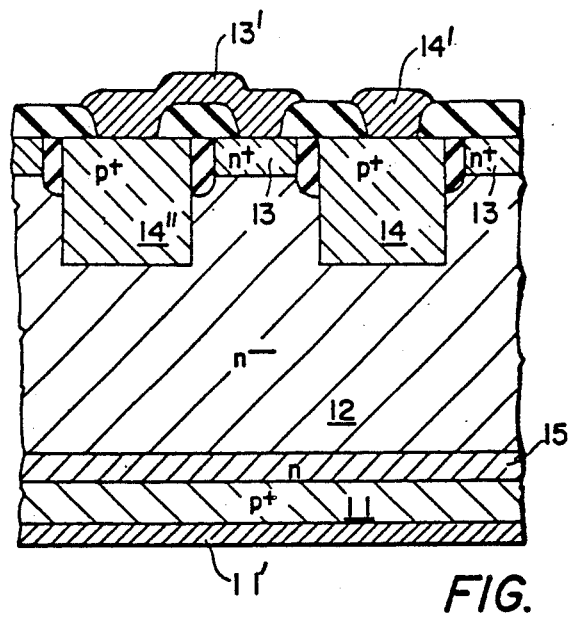

In FIG. 8, a $p^+$ type region 14 serves as a driving gate region, and another $p^+$ type region 14" is a fixed potential gate region. The size of the effective or driving gate region can be reduced to one half, so that the static capacitance accompanying therewith becomes small, and accordingly the operating speed increases. Concurrently therewith the amount of holes flowing into the driving gate region and hence into the control circuit becomes reduced, and there can be obtained a large current gain.

Figure 9:
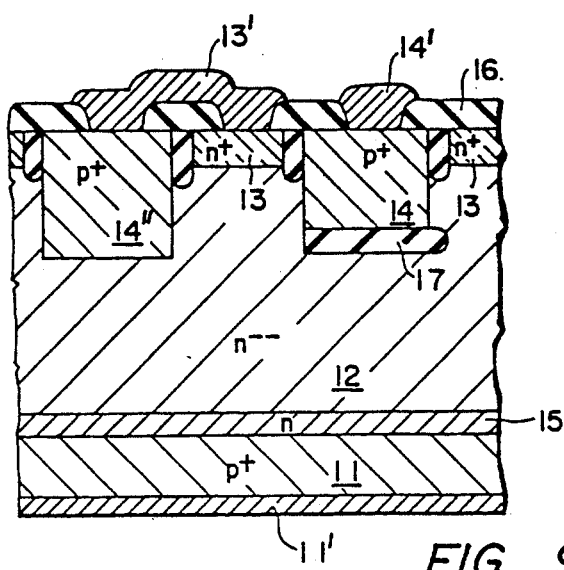

FIG. 9 shows a modification wherein an insulated layer is provided on the bottom surface of a driving gate region in order to further enhance the current gain. According to this structure, the amount of those holes flowing into the driving gate region becomes very small, so that current gain can be greatly improved.

Figure 10:
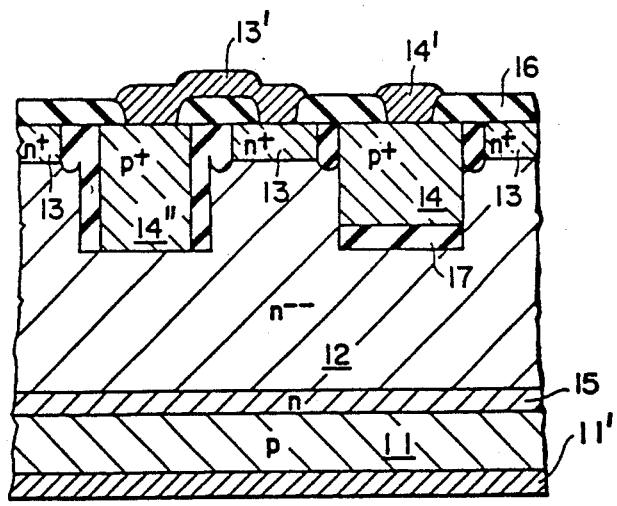

One of the drawbacks of split-gate structures may be that, when a large reverse gate bias is applied to the driving gate region to block a high anode voltage and to maintain the "off" state of the device, a punching-through current may flow between the fixed potential gate region and the driving gate region. FIG. 10 shows a structure designed so that, while making good use of the features of the split-gate structure, the punching-through current between the gate regions, which may be considered as the only drawback of the split-gate structure, is minimized. In FIG. 10, an insulating layer is provided on a side surface of the fixed potential gate region located along the channel region. According to this structure, a considerable part of those holes flowing from the anode region enter into the bottom surface of the fixed potential gate region to join the current of the cathode electrode.

Figure 11:
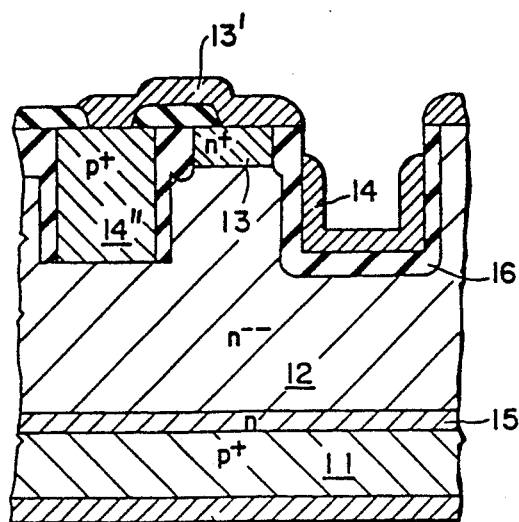

FIG. 11 shows a further embodiment of the static induction thyristor having a split-gate structure wherein the driving gate region is comprised of a MIS-gate region, to derive a large current gain and to enhance the flow of holes.

FIGS. 8 through 11 invariably show structures wherein both the driving gate region and the fixed potential gate region are of almost the same depth in the semiconductor body. It should be understood, however, that these two gate regions do not necessarily have the same depth. By providing a fixed potential gate region having a greater depth than the other gate region, it is possible to improve the absorption of holes, and to further facilitate the blocking of the effect of a high anode voltage.

The gate regions 14 and 14' may be at least partly formed of polycrystalline semiconductor. For example, polycrystalline regions heavily doped with acceptors may be deposited and then subjected to heat treatment to form $p^+$ type gate regions.

Figure 12A:
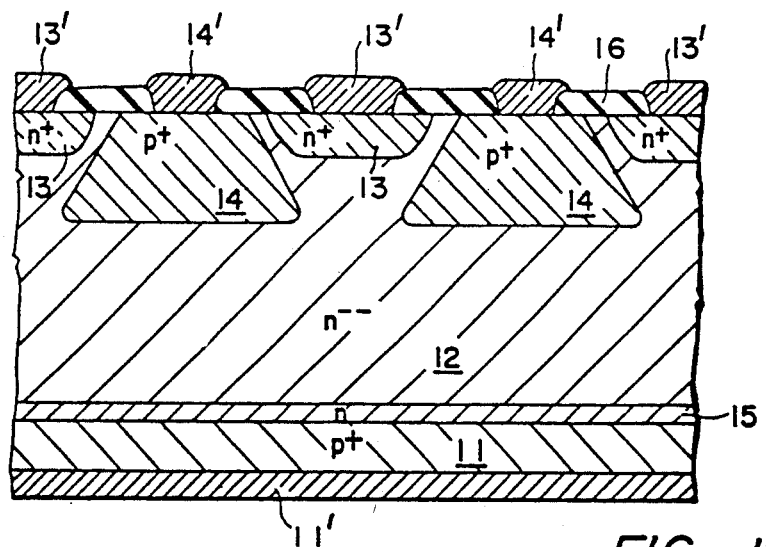

FIG. 12A shows a modified structure. In the planar gate structure corresponding to that of FIG. 2, the gate region 14 has a progressively larger area as the location goes farther from a main surface of a semiconductor body. This static induction thyristor has the features that the gate-cathode breakdown voltage is great, and that the, static capacitance is small, and moveover, that the cutting-off efficiency is good.

Figure 12B:
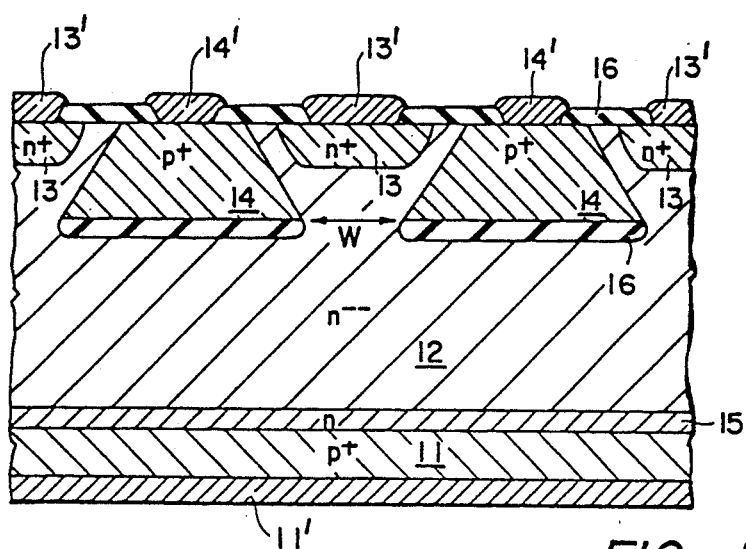

FIG. 12B shows a further improved structure in which an insulating layer 16 is formed on the bottom surface of each of the $p^+$ type region 14 to increase the current gain at the cut-off time of the device. The structure shown in FIG. 12B can be constructed by first making a porous silicon region of the $p^+$ type gate region by relying on known anodic oxidation technique using a hydrofluoric acid solution, and thereafter by forming an $SiO_2$ insulating layer 16 by relying on implantation of oxygen, and thereafter by diffusion or ion-implantation of boron (B). The smaller the distance w between the gate regions 14, the better in order to materialize a great forward blocking voltage by a small gate bias. It is desirable to make this w small by arranging the gate regions and, the cathode region as close to each other as possible without causing the gate-cathode breakdown voltage to drop lower than the desired level. As a matter of course, an excessively small value of w will result in an increase in the resistance at the conducting state.

The structure shown in FIG. 12A and FIG. 12B in which the gate region has a larger area as its location goes farther from the main surface can be directly or modifiedly applied to the structures shown in FIGS. 4, 6, 8, 9, 10 and 11.

The structures for increasing the forward blocking voltage have been described by referring to some concrete embodiments. It is needless to say that the invention is not limited to these embodiments. The respective regions may have conductivity types which are the inverse of those shown and described above, as a matter of course. In such case, however, the region 11 will be comprised of an $n^+$ type region, and hence a negative voltage will be applied thereto in the forward biasing state. In the present specification, however, this region 11 will be called an anode region irrespective of the polarity of the voltage which is applied. In short, any structure may be used provided that a thin layer having a high impurity concentration and having a conductivity type opposite to that of the anode region is inserted on that side of this anode region facing the cathode region in adjacent relationship to said anode region, and that the channel-constituting region from this thin layer up to the cathode region is constructed by a region having as low an impurity concentration as possible. The low impurity concentration region will have a uniform electric field intensity throughout the entire region so as to increase the maximum blocking voltage. Thus, it is possible to increase the field intensity substantially up to the avalanche-starting breakdown electric field throughout the low impurity concentration region. Drop of blocking voltage due to carrier injection on the anode region side can be prevented by the thin region having a relatively high impurity concentration. Because said thin region has a small thickness, the carrier injection efficiency from the anode region is good, and also because the injected carriers are therefrom injected into the channel region at a great speed, this device has the features represented by high speed, a small forward voltage drop and a large current capacity at the conducting state. In order to increase the maximum blocking voltage, it is only necessary to make the region 12 thick. In order to obtain a large current, it is only necessary to increase the number of the channels.

Figure 13A:
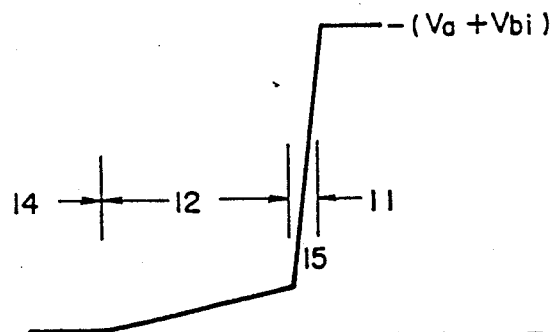
FIGS. 13A and 13B are diagrammatic illustrations of a potential distribution and an electric field distribution, respectively, of the static induction thyristor of the present invention when applied with a reverse voltage.
Figure 13B:
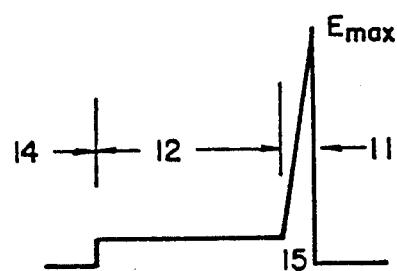

Hereinabove, description has been made with emphasis being placed on the increase in the forward maximum blocking voltage, while keeping the cathode-anode distance as small as possible. It should be noted here that in many cases, a thyristor is required to have not only a high forward blocking voltage but also, concurrently therewith, a high reverse breakdown voltage. This reverse breakdown voltage is determined by the reverse direction characteristic of, for example, the $p^+nn^-n^+$ diode structure extending from the anode region to the cathode region shown in FIG. 2A. In FIGS. 13A and 13B, there are shown the gate-anode potential distribution and electric field distribution, respectively, when a reverse voltage $V_a$ is applied in case the $n^-$ type region 12 can be substantially regarded as an intrinsic region because of the very low impurity concentration of this region. The maximum electric field intensity at the reversely biased anode junction in FIG. 13B is given substantially by:

$$E_{max} \approx \frac{1}{l_1 + l_3}\left( V_a + V_{bi} + \frac{N_{D2}q l_3}{\epsilon}\left( l_1 + \frac{l_3}{2} \right) + \frac{q N_{D1}}{\epsilon} l_1 \left( \frac{l_1}{2} + l_3 \right) \right). \quad (3)$$

When this maximum electric field intensity $E_{max}$ reaches an avalanche breakdown electric field $E_B$, an avalanche current will begin to flow. Accordingly, the maximum reverse breakdown voltage $V_{armax}$ is given by the following formula:

$$V_{armax} \approx E_B(l_1 + l_3) - V_{bi} - \frac{N_{D2}q l_3}{\epsilon}\left( l_1 + \frac{l_3}{2} \right) - \frac{q N_{D1}}{\epsilon} l_1 \left( \frac{l_1}{2} + l_3 \right). \quad (4)$$

Let us suppose, for example, that $l_1 = 500\mu m$; $N_{D1} = 1 \times 10^{12} cm^{-3}$; $l_3 = 1\mu m$; and $N_{D2} = 1 \times 10^{16} cm^{-3}$, and if $E_B = 200$ KV/cm, $V_{armax}$ will become almost 2000V. Since the maximum forward breakdown voltage is 7000V or more, there will often be the cases in which a reverse breakdown voltage of this magnitude is not sufficient. In the above-mentioned Formulas (3) and (4), consideration about the gate-anode punchthrough has not been considered.

Figure 14:
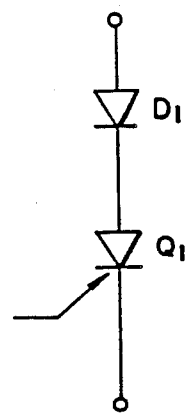
FIG. 14 is a diagrammatic illustration showing an example of use of the static induction thyristor according to the present invention.

Accordingly, in practice, the reverse breakdown voltage will not show an improvement up to 2000V. In order to have this device perform an operation with a reverse breakdown voltage of a level similar to that of the forward breakdown voltage, it is only necessary to connect, for example, a silicon Schottky diode in series with this device in a manner as shown in FIG. 14. In this FIGURE, $D_1$ represents a Schottky diode, and $Q_1$ represents a static induction thyristor of the present invention. The Schottky diode may be formed by providing an $n^+$ type region on one of the main surfaces of an n type relatively high resistivity region having a predetermined thickness, and by providing, on the other main surface, a Schottky junction using Al, Pd, Pt, Au, or other metals. The impurity concentration and the thickness of said n type relatively high resistivity region may be determined based on such factors as the required value of the reverse breakdown voltage and the value of the forward voltage drop. Since the Schottky diode allows a number of carriers to flow, the switching speed of the device is great. Also, a Schottky diode is such that the forward voltage drop tends to become slightly great, so that in order to overcome this problem, it is only necessary to employ, for example, a $p^+in^+$ diode.

In order to realize a predetermined forward breakdown voltage and a predetermined reverse breakdown voltage can be realized using only the static induction thyristor of the present invention, by selecting the impurity concentrations and the thicknesses of the $n^-$ type region 12 and the n type region 15 substantially as follows. The reverse breakdown voltage is determined by the maximum electric field at the $p^+(11)n(15)$ junction reaching an avalanche-starting threshold electric field $E_B$. Even when such threshold electric field is not reached, the reverse breakdown voltage is determined by the fact that the depletion layer extending from the anode region completely reaches the $p^+$ type region 14, causing either a punching-through current or a punch-through current to begin flowing. As such, it would be desirable to select the values of the impurity concentrations and the thicknesses of these regions to cause the aforementioned two kinds of phenomena at substantially the same time, as follows:

$$E_{max} \approx \frac{N_{D1}ql_2}{\epsilon} + \frac{N_{D2}ql_3}{\epsilon} \approx E_B. \quad (5)$$

$$V_{armax} \approx \frac{N_{D1}ql_2^2}{2\epsilon} + \frac{N_{D2}ql_3^2}{2\epsilon} + \frac{N_{D1}ql l_{23}}{\epsilon}. \quad (6)$$

Figure 15:
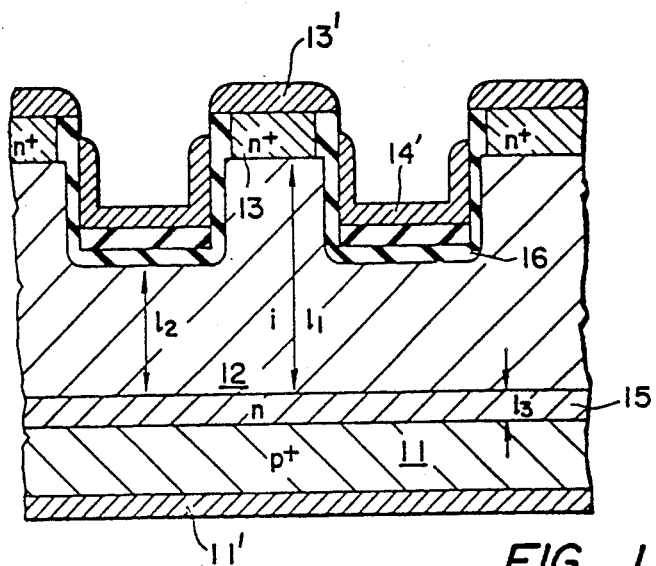
FIGS. 15, 16 and 17 are diagrammatic illustrations of sectional structure examples of the static induction thyristor according to the present invention.

More particularly, it is only necessary to arrange so that, when the intensity of the electric field at the interface of $p^+(11)n(15)$ has become substantially equal to the avalanche-starting threshold value of electric field $E_B$, the depletion layer extending from the anode region will reach the gate region 14. The reverse voltage at such time will be given substantially by the Formula (6). If $N_{D1} \approx 1 \times 10^{13}$ cm$^{-3}$ and $l_2 \approx 500\mu$m, and $N_{D2} \approx 2 \times 10^{15}$ cm$^{-3}$ and $l_3 \approx 3\mu$m, a reverse voltage of about 2000V can be provided. The maximum forward breakdown voltage at such time will become about 6800V. It is often the case that the reverse breakdown voltage is determined by punching-through of the $p^+$ type gate region 14. Accordingly, in an insulated-gate type static induction thyristor (MOS-SI thyristor) as shown in FIG. 15, the problem of punching-through of the gate region at the time of application of a reverse voltage is not present, so that there can be obtained a great reverse breakdown voltage. Suppose, for example, the impurity concentration of the region is $1 \times 10^{12}$ cm$^{-3}$ or less, and that $l_1 Z l_2 Z 500\mu$m, and $l_3 = 1\mu$m and $N_{D2} = 6 \times 10^{15}$ cm$^{-3}$, a value close to 5000V for both maximum forward blocking voltage and reverse breakdown voltage can be realized.

As shown in FIG. 4, where an insulating layer is provided on the bottom surface of the gate region 14, it is possible to obtain a great forward blocking voltage and a great reverse breakdown voltage. With the structure that no punching-through current will flow from the gate region at the time of application of a reverse voltage, the region 12 needs to be designed so as to be substantially an intrinsic region, and to satisfy the following formula:

$$\frac{N_{D2}ql_3}{\epsilon} \approx \frac{E_B}{2}, \quad (7)$$

so that the maximum forward blocking voltage as well as the reverse breakdown voltage will both have a value close to $E_B l_2/2$.

Figure 16A:
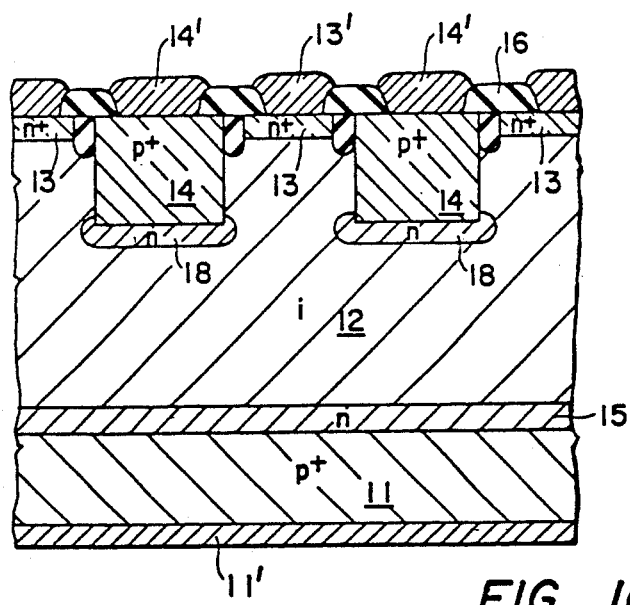
Figure 16B:
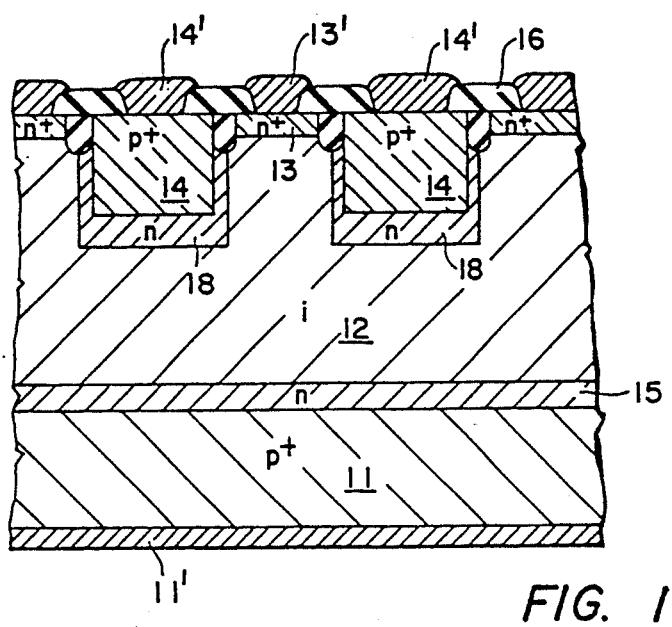

When the gate region is formed as a junction type, it is preferred to provide a thin layer 18 having a relatively high impurity concentration on the bottom surface of the gate region. In FIG. 16A, the n type region 18 is provided only on the bottom surface portion of the gate region 14. In FIG. 16B, it is provided so as to surround the $p^+$ type gate region 14. In this latter structure, the n type region 18 has such thickness that it is greater in the bottom portion than in the portion adjacent to the channel region.

Description has been made hereinabove of examples wherein the anode region is formed with a uniform continuous $p^+$ type region. However, such structures have the inconvenience that their cut-off characteristic is deteriorated to a certain degree if those electrons which are stored in the n type region 15 located in front of the anode region fail to disappear at the cut-off time in accordance with the externally applied voltage. Moreover, when the device operates at a high ambient temperature such as 130°~175° C., thermally generated electrons tend to accumulate within the potential well at the anode junction, thus causing hole injection from the anode region. To avoid such inconvenience, it is only necessary to arrange the anode region to be comprised of $n^+$ type regions 21 and $p^+$ type regions 11 which are disposed in alternate fashion. The electrode 11' is formed so that it provides an ohmic electrode for both the $p^+$ type regions 11 and the $n^+$ type regions 21. Thus, those electrons which are stored in the n type region 15 are absorbed into the $n^+$ regions 21, so that a quick cut-off is realized. When it is intended to incorporate such structure onto the anode side, the following consideration is required. In the event that the length of pitch of the $p^+$ type regions 11 in the direction along the anode electrode (i.e. the transverse width of regions 11) is excessively short, the resumption of conduction cannot be carried out satisfactorily. This is because of the fact that those electrons which have travelled into the n type region 15 from the cathode side will enter into the $n^+$ type regions 21 through diffusion prior to those electrons displaying the effect of pulling down the barrier for the $p^+$ type regions 11. As such, it is effective to set the length (transverse width) of each of the $p^+$ type regions 11 along the anode surface to have a value in the vicinity of twice the diffusion distance through which those electrons stored in the n type region 15 diffuse into the $n^+$ type regions 21 or a little greater than such value. It should be understood, however, that if said length of the $p^+$ type region 11 is excessively greater than said value, those electrons stored in the n type region 15 cannot be withdrawn quickly into the $n^+$ type regions 21 at the cut-off time.

The role of the introduction of $n^+$ type region 21 to the anode region should be understood to be as follows. Even when the maximum forward blocking voltage is applied on the device, there remains a neutral region in the n type region 15. This neutral region has an effective resistance $r_B$ to the $n^+$ type region 21. When the device operates at a high ambient temperature, there appears an appropriate current $i_t$ due to the thermally generated electrons which flow through the effective resistance $r_B$. Impurity concentration and thickness of the n type region 15 and the anode structure must be designed to satisfy the condition of $i_t r_B << V_{bi}$. If this condition is satisfied, the device exhibits an excellent forward blocking even at a high ambient temperature.

Furthermore, if the reverse gate bias voltage is removed and the device starts a switch-on action, an appreciable amount of electrons is injected from the cathode region, and they flow into the n type region 15. In such situation, an appreciable current $i_e$ flows through the effective resistance $r_B$. The voltage drop $i_e r_B$ across the effective resistance is designed not less than the value $V_{bi}$ in order to drastically decrease the potential barrier for the hole injection, thus causing hole injection from the anode region and turning the device "on".

Figure 17:
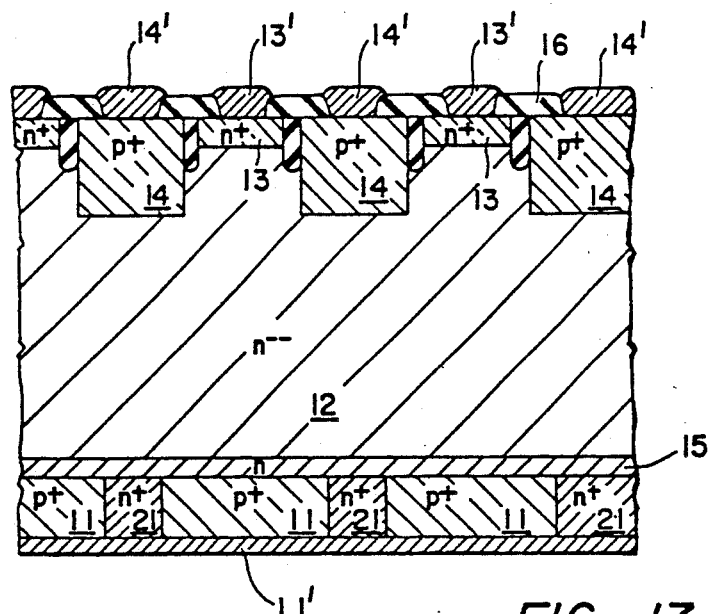

It should be understood also that such structure on the anode side as shown in FIG. 17 can equally effectively be applied to all of those embodiments of the present invention which have been stated and illustrated up to FIG. 16. In each of such applications, the cut-off characteristic and the forward blocking at high ambient temperature are improved.

In order to increase the switch-off speed at the cut-off time, it is only necessary to add to, for example, the region 12 an appropriate amount of substance having a killer effect. If the semiconductor is made of silicon, a typical killer material is, for example, Au. It should be noted, however, that if the density of the killer is excessively high, the distribution, within the channel region, of those carriers injected from the cathode region and the anode region will become steep, causing an increase in the space charge resistance, and causing an increase in the voltage drop. Therefore, it is necessary to increase the density of killer within the range in which the voltage drop becomes a predetermined value or less than that. The diffusion lengths of electrons and holes must be designed longer than at least $l_2$.

For example, in a device having a planar structure added with an improved anode structure shown in FIG. 17 wherein $l_2 \simeq 400 \sim 500 \mu m$, $l_3 \simeq 1 \mu m$, $N_{D1} \simeq 10^{12} cm^{-3}$, and $N_{D2} \simeq 1 \times 10^{16} cm^{-3}$, and having cathode stripes of $2 \times 100 \mu m$ in a number corresponding to $10^6$ of channels, there can be materialized an operation of such extent as a current value of about 2000A at the time of conduction, a switch-off time of less than a few $\mu sec$ at the cut-off time and a voltage drop of about 2V or less.

Those factors of device-designing such as $l_1$, $l_2$, $l_3$, $N_{D1}$ and $N_{D2}$ employed in the manufacture of a device may be determined depending on the required specifications.

The static induction thyristor according to the present invention can be manufactured by relying on known crystal growth, diffusion, ion-implantation, lithography, fine processing oxidation, CVD, wet and dry etching and/or like techniques.

The static induction thyristor according to the present invention has a high blocking voltage, a large current at conducting time, and a small voltage drop, and a high switching speed, and thus its industrial value as an element for high power control and as a switching element is extremely great.

What is claimed is:

1. A static induction type thyristor comprising:
   a semiconductor channel region of a substantially uniform low impurity concentration having opposed major surfaces;
   a first main electrode means comprising a first high impurity concentration semiconductor region having a first conductivity type formed adjacent to one of said major surfaces of the channel region;
   a thin layer region having an impurity concentration higher than that of said channel region and a thickness much smaller than that of the channel region and made with a semiconductor of said first conductivity type and formed on the other major surface of the channel region;
   a substantially flat second main electrode means comprising:
   a second highly-doped semiconductor region having a second conductivity type opposite to said first conductivity type and a third highly-doped semiconductor region having the first conductivity type, and a conductive electrode formed on said second and third semiconductor region;
   the second and third semiconductor regions being formed on that side of said thin layer region located opposite to the side adjacent to said channel region, the impurity concentration of said second and third semiconductor regions being much higher than that of said thin layer region;
   said second and third semiconductor regions being disposed in alternate fashion on that side of said thin layer region located opposite to the side adjacent to said channel region, and said third semiconductor region having an area smaller than that of said second semiconductor region on said that side of said thin layer region;
   a highly-doped gate region having said second conductivity type and provided adjacent to said channel region in the vicinity of said first semiconductor region and at such site that at least one current channel for those carriers supplied from said first semiconductor region and said second semiconductor region is formed in that portion of said channel region which is surrounded substantially by said gate region;
   said second semiconductor region being formed at a location facing said first semiconductor region; and
   said third semiconductor region being formed at a location facing said gate region.

2. A static induction type thyristor according to claim 1, in which:
   said thin layer region has an impurity concentration at least one order of magnitude higher than said predetermined low impurity concentration in said channel region.

3. A static induction type thyristor according to claim 1, in which:
   said thin layer region has an impurity concentration at least two orders of magnitude higher than said predetermined low impurity concentration in said channel region.

4. A static induction type thyristor according to claim 1, in which:
   said channel region has the same conductivity type as that of the first semiconductor region, and is made with a semiconductor having a substantially lower impurity concentration than that of said first main electrode region.

5. A static induction type thyristor according to claim 1, in which:
   said predetermined low impurity concentration of said channel region is selected lower than $1 \times 10^{16}$ atoms/cm$^3$.

6. A static induction type thyristor according to claim 1, in which:
   said predetermined low impurity concentration of said channel region is selected in a range between $1 \times 10^{12}$ atoms/cm$^3$ and $1 \times 10^{15}$ atoms/cm$^3$.

7. A static induction type thyristor according to claim 1, in which:
   said thin layer region has an impurity concentration at least one order of magnitude higher than said predetermined low impurity concentration of said channel region.

8. A static induction type thyristor according to claim 1, in which:

said impurity concentration of said thin layer region is at least one order of magnitude lower than that of said first semiconductor region.

9. A static induction type thyristor according to claim 1, in which:
said impurity concentration of said thin layer region is at least two orders of magnitude lower than that of said first semiconductor region.

10. A static induction type thyristor according to claim 1, in which:
said thin layer region has a thickness much smaller than that of said another portion of said channel region.

11. A static induction type thyristor according to claim 1, in which:
said current channel defined by said gate regions has a length smaller than that of said another portion of said channel region.

12. A static induction type thyristor according to claim 1, in which:
said gate region is formed so that:
a surface of said first semiconductor region, and surface of said gate region, are positioned on a same substantially flat surface parallel with said thin layer region; and further that:
those end portions of the gate region located closer to the thin layer region extend toward the thin layer region beyond the end portion of the first semiconductor region.

13. A static induction type thyristor according to claim 1, in which:
said gate region is formed so that:
surfaces of the gate region are positioned closer to said thin layer region than surfaces of said first semiconductor region; and
those end portions of said gate region located closer to said thin layer region are positioned toward the thin layer region beyond that end portion of the first semiconductor region located closer to this thin layer region.

14. A static induction type thyristor according to claim 1, in which:
said channel region contains a certain concentration of a substance having a killer effect for charge carriers.

15. A static induction type thyristor according to claim 1, in which:
said substance having a killer effect is at least one selected from a group consisting of Au, Cu, and Ni.

16. A static induction type thyristor according to claim 1, in which:
said first main electrode means is provided in a plural number, and they are coupled together by another common conductive electrode.

17. A static induction type thyristor according to claim 1, in which:
said thin layer region (15) has impurity concentration $N_{D2}$ and thickness $l_3$, said channel region (12) has impurity concentration $N_{D1}$ and thickness $l_2$, and wherein said impurity concentrations and thicknesses are defined by the relationship:

$$V_{Bmax} \approx \left( E_{qs} - \frac{N_{D1}ql_2}{2} \right)l_2 + \frac{N_{D2}ql_3^2}{2\epsilon}$$

where $V_{Bmax}$ is a maximum blocking voltage, $E_{qs}$ is an electric field intensity in the vicinity of the gate region, q is an electron charge, and $\epsilon$ is a dielectric constant of the semiconductor region of said thyristor.

18. A static induction type thyristor according to claim 1, in which:
said gate regions (14) and said cathode regions (13) have insulation means interposed therebetween to form a separation barrier on said major surface of said substrate whereby to maintain sufficient cathode-to-gate breakdown voltage at a relatively high forward blocking voltage of said thyristor.

* * * * *

UNITED STATES PATENT AND TRADEMARK OFFICE
CERTIFICATE OF CORRECTION

PATENT NO. : 4,935,798

DATED : June 19, 1990

INVENTOR(S) : NISHIZAWA, et al.

It is certified that error appears in the above-identified patent and that said Letters Patent is hereby corrected as shown below:

Col. 3, line 24, change "$n^+n^-P^+$" to -- $n^+n^-p^+$ --.

Col. 4, line 50, change "KV" to -- kV --.

Col. 6, lines 25, 27, 29, 32, 34, 37, 39 and 40, change "KV" to -- kV --.

Col. 12, line 32, change "KV" to -- kV --.

Col. 13, line 41, change "$l_1 Zl_2 Z500$" to -- $l_1 \simeq l_2 \simeq 500$ --.

Signed and Sealed this

Third Day of March, 1992

Attest:

HARRY F. MANBECK, JR.

*Attesting Officer*  *Commissioner of Patents and Trademarks*